United States Patent [19]

Schaefer

[11] 4,400,660
[45] Aug. 23, 1983

[54] WIDE BANDWIDTH HIGH VOLTAGE REGULATOR AND MODULATOR

[75] Inventor: Martin A. Schaefer, St. Petersburg, Fla.

[73] Assignee: Sperry Corporation, New York, N.Y.

[21] Appl. No.: 304,753

[22] Filed: Sep. 23, 1981

[51] Int. Cl.³ .............................................. G05F 1/44
[52] U.S. Cl. .................................... 323/270; 323/280; 320/1
[58] Field of Search .................... 320/1; 323/270, 273, 323/280; 328/267

[56] References Cited
U.S. PATENT DOCUMENTS 3,551,788 12/1970 Summer ............................. 323/270
4,069,449 1/1978 Farnsworth ...................... 320/1 X Primary Examiner—William M. Shoop
Attorney, Agent, or Firm—Howard P. Terry

[57] ABSTRACT

A combined high voltage power supply regulator and modulator which may be used with, for example, voltage tuned microwave devices. The circuit is characterized by a capacitively coupled variable impedance comprising fast acting semiconductor devices which are disposed in the low voltage return leg of the power supply to facilitate biasing. The variable impedance is controlled by a feedback signal to remove unwanted power supply ripple and may also be controlled by a wide variety of modulation signals to produce a modulated voltage for application to the voltage tuned microwave device.

13 Claims, 2 Drawing Figures

WIDE BANDWIDTH HIGH VOLTAGE REGULATOR AND MODULATOR

BACKGROUND OF THE INVENTION

1. Field of the Invention

This invention relates generally to a series type voltage regulator and modulator, and in particular to a combined regulator and modulator for use in high voltage applications such as for radar and microwave power supplies.

2. Description of the Prior Art

Microwave tubes such as magnetrons, Klystrons, traveling wave tubes (TWT), and the like must usually be operated at specific peak pulse currents, within a tolerance of a few percent to hold power output constant. This is desirable from the system standpoint, because low power output reduces system performance, and high power output is wasteful of prime power, overheats components, and raises the cooling burden. For example, a supply voltage drop of only two percent will cause a wide bandwidth TWT device to lose half of its output power. In crossed-field tubes other modes may lie near the normal operating point; these usually must be avoided. In linear beam tubes gain and bandwidth shift rapidly with changes in beam current. Thus it is generally desirable to supply microwave tubes with a rippleless d.c. voltage, and in the prior art a primary control regulator is often used for this purpose. It is called a primary regulator because it is frequently placed in the primary or a.c. side of the high voltage power supply transformer. Primary regulators are slow to respond to rapid fluctuations in power line voltage and transients, and thus large and expensive passive filter components are usually required. To complement the primary regulator, a series regulator is often added on the secondary or d.c. side of the power supply, as described in Skolnick, M. I. *Radar Handbook*, Chapter 7.17, McGraw-Hill, Inc., New York, 1970. The prior art series regulator is typically placed between the output of the high voltage power supply and the load which is often a microwave frequency vacuum tube operating at an extremely high voltage, often in excess of 9,000 volts. Because the regulator must interact with this extremely high voltage, the conventional regulator employs one or more heavy duty vacuum tubes. A shortcoming of the conventional regulator is that, being designed to withstand extremely high voltages, it cannot respond as fast as present day semiconductor devices. Semiconductor devices are not widely used in conventional series regulators because it is very difficult to couple these delicate devices across the extremely high voltage and maintain proper biasing for safe operation of the semiconductor.

Aside from regulating the high voltage power supply to remove unwanted ripple, it is also frequently desirable to intentionally impress an amplitude modulation of the power supply current in order to induce radio frequency oscillations in the microwave tube. This process, known as modulation, is discussed in Skolnick, *Radar Handbook*, Supra at Ch. 7.11-7.16. The typical modulator is a separate circuit from the power supply regulator and often employs heavy duty vacuum tube devices, large capacitors, and even coupling transformers. One popular class of modulators is the active-switch modulator, also called hard-tube modulators. Active switch modulators require switching devices that can be both turned on and turned off at will, since the switching device controls both the beginning and the end of the pulse. A frequently used active switch modulator is the cathode pulser which controls the full beam power of the r.f. tube, either directly or through a coupling circuit. Because the beam power is at extremely high voltage the same coupling difficulties of regulator circuits are encountered when semiconductor devices are used. Despite these difficulties, there is a great deal of interest in using semiconductor devices for their low cost, small size and weight, low power consumption, and high operating speed. Special circuits have been developed, for example, to make SCR devices turn on and off at desired times by means of other SCRs. However, these circuits do not adequately solve the problem of inserting and biasing a wide range of delicate semiconductor devices in high voltage circuits. Furthermore, present day modulators are only capable of using a.c. type signals for modulation; more complex modulation such as digital noise and swept high frequency spot noise have not heretofore been possible.

The present invention solves the biasing problem inherent in prior art power supply regulator circuits and modulators, and provides a very responsive circuit for both regulating and modulating a high voltage power supply output. The invention is capable of applying a wide range of modulations ranging from the conventional a.c. modulation to the exotic digital noise and swept high frequency spot noise.

SUMMARY OF THE INVENTION

The present invention provides an apparatus for controlling the electrical power from a high voltage power supply source, which source has an output leg at a relatively raised voltage for transmitting electrical power to a load such as a radio frequency tube, and has a return leg at a relatively depressed voltage for returning electrical currents from the load to the supply. The apparatus has a sensing means responsive to the output of the power supply for detecting changes in electrical power and has a variable impedance means capacitively coupled to the output leg of the power supply which is responsive to the sensing means so that changes in the power supply output can be detected and compensated for, thus providing power supply regulation. The circuit also includes a means for applying a time varying signal to the variable impedance means in order to modulate its impedance value and thereby modulate the power supplied to the radio frequency tube load.

For a more detailed understanding of this invention, reference is made to the following description and the accompanying drawings.

DESCRIPTION OF THE PREFERRED EMBODIMENTS

The present invention has the capability of operating as a series type voltage regulator and simultaneously as a modulator for controlling the energy delivered to microwave tubes. In one presently preferred embodiment, the invention is adapted for supplying electrical energy to a tube having a grounded collector. A second preferred embodiment is adapted for supplying energy to a tube of the depressed (ungrounded) collector type.

Figure 1:
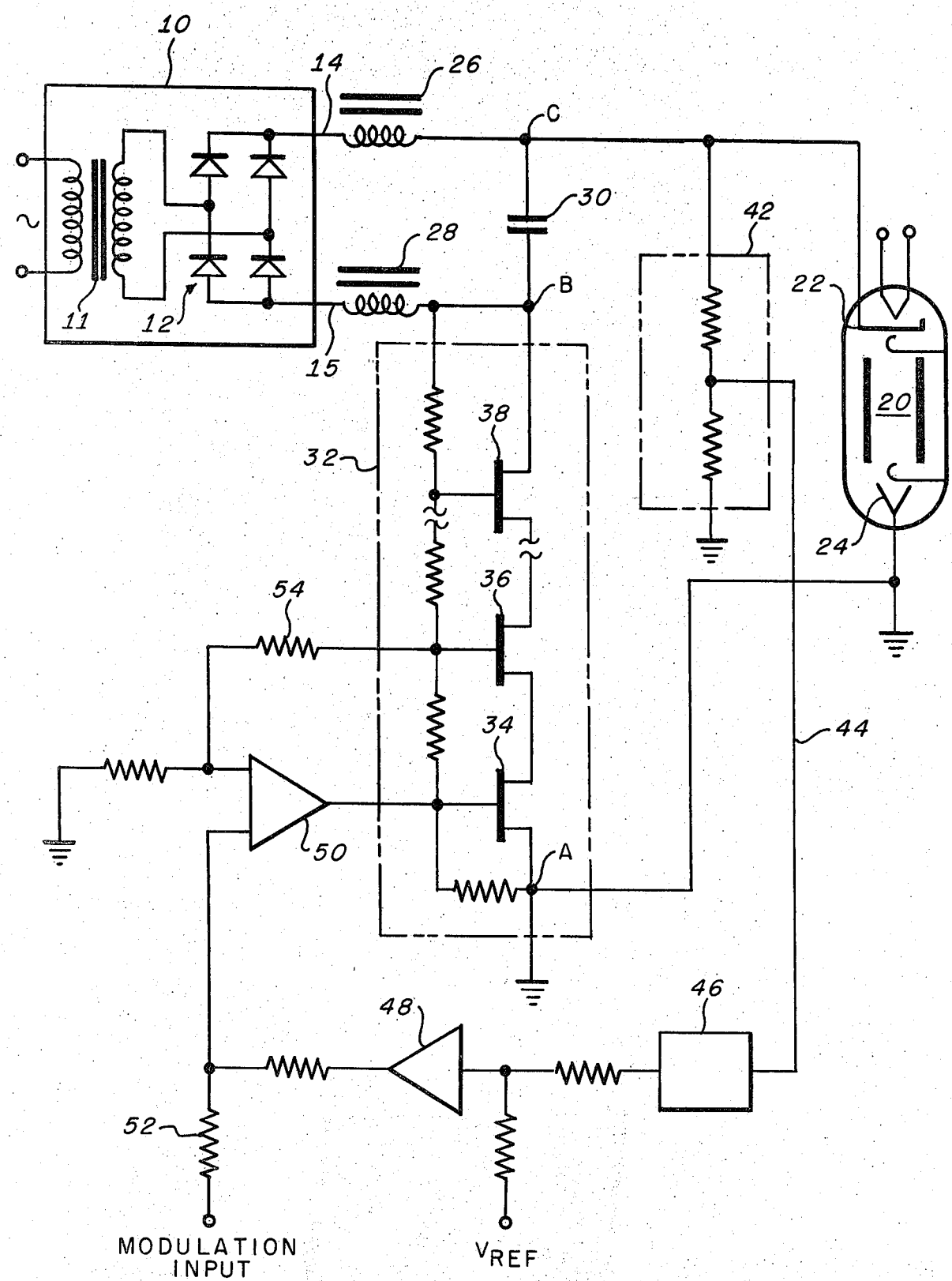
FIG. 1 is a schematic diagram illustrating one embodiment of the invention including a voltage tuned magnetron tube.

Referring to FIG. 1, the first preferred embodiment comprises a high voltage source 10 of electrical energy, which may be a transformer 11 and bridge rectifier 12 in the usual configuration. The high voltage source 10 has a high voltage output leg 14 for delivering power to a load 20 and also has a substantially lower voltage return leg 15 for completing a circuit by conducting currents from the load 20 to the source 10. The load 20 may be, for example, a radio frequency or microwave frequency vacuum tube, such as a magnetron, Klystron, or the like. In FIG. 1 the load 20 is a microwave vacuum tube having a cathode 22 and a collector 24. The collector is grounded according to common practice. The output of high voltage source 10 is filtered through a first filter choke 26 in series with the output leg 14, and a second filter choke 28 in series with the return leg 15. A shunt capacitor 30 is connected in parallel with output leg 14 and return leg 15. This capacitor in conjunction with chokes 26 and 28 comprises a passive LC filter network to smooth unwanted power supply ripple in the usual fashion. The shunt capacitor 30 also provides a coupling function. A variable impedance means 32 is coupled between the collector 24 and shunt capacitor 30. Note that, like the collector 24, the variable impedance 32 is inserted (at node A) at ground potential. The variable impedance 32 is also connected (at node B) to the low voltage return leg 15. Shunt capacitor 30 isolates the variable impedance from the high voltage output leg 14, and yet couples a.c. signals to permit energy to flow through the impedance into and out of the high voltage leg (at node C). Those skilled in the art will recognize that placement of the variable impedance 32 in series with the return leg 15 with protective a.c. coupling to the high voltage leg 14 permits delicate semiconductors to be biased with impunity from destructive high voltages.

The variable impedance 32, in the preferred embodiment, comprises a pluarlity of active devices such as field effect transistors 34, 36 and 38 arranged in a series ladder network and biased by a network of resistors 40 to insure that each device has the proper voltage across it. In most applications the field effect transistors are biased to operate in the linear active region.

The invention further comprises a resistive divider network 42 connected between the high voltage output leg 14 and ground to sense voltage or current changes in the energy supplied to load 20. A signal from the resistive divider network 42 is carried by electrical lead 44 through an optional low pass filter 46 and then is resistively coupled to the input of an error amplifier 48. Also resistively coupled to the input of error amplifier 48 is a reference voltage $V_{REF}$, which can be supplied by any of a number of well known voltage sources. The output of the error amplifier 48 is applied to the input of a summing amplifier 50. The summing amplifier also includes a modulation input means 52, which may be, for example, a resistive coupling to the summing amplifier 50. It will be understood that while two amplifiers, error amplifier 48 and summing amplifier 50, are described and shown in FIG. 1, these two amplifiers might be replaced by a single amplifier having inputs for sensing the divider network 42, for sensing $V_{REF}$, and for applying a modulation signal. However, it is not believed that this modification would represent much of a cost savings inasmuch as a multitude of operational amplifiers can now be manufactured on a single integrated circuit chip. The output of summing amplifier 50 is applied to the gate of the first field effect transistor 34, and a feedback resistor 54 is connected to sense the drain voltage of FET 34 which is fed back to the summing amplifier 50 to form a more stable closed loop circuit. This arrangement permits the voltage across each FET to be set at any desired value within its operating range. The voltage across each FET is then amplified by the number of FETs in the series ladder network. In this regard, the number of FETs utilized in the ladder network will depend upon the permissible voltage drop across each device and the final voltage desired at node B. Thus while three FETs are shown in FIG. 1 and described herein, it will be understood that the number of devices is not critical and depends upon the particular application.

It will be recognized that the circuit thus described comprises one feedback loop nested within a second feedback loop. A first feedback loop is established by feeding the signal from the resistive divider network 42 through error amplifier 48 and summing amplifier 50 to the variable impedance 32. Within the first feedback loop is a second feedback loop established by feeding a signal from the variable impedance, through feedback resistor 54 to the summing amplifier 50.

Figure 2:
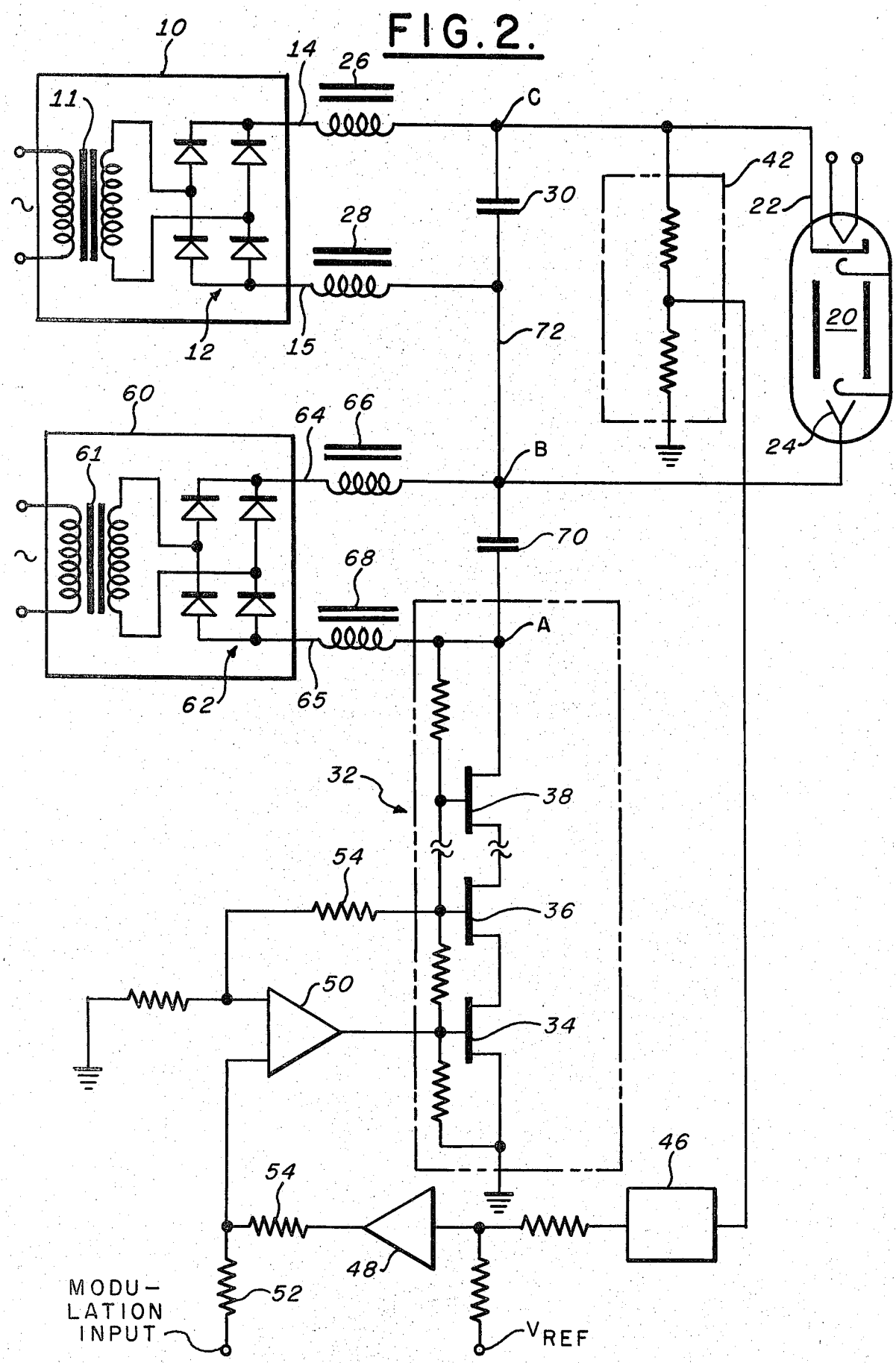
FIG. 2 is a schematic diagram illustrating another embodiment of the invention including an output tube of the depressed collector type.

A second preferred embodiment is shown in FIG. 2. This embodiment is adapted for use with microwave tubes of the depressed, or ungrounded, collector type. The second embodiment shown in FIG. 2 is essentially the same configuration as the first embodiment with the following differences. The second embodiment comprises an additional low voltage source 60, which may include a transformer 61 and bridge rectifier 62. The low voltage source has an output leg 64 and a return leg 65 connected to a third filter choke 66 and fourth filter choke 68, respectively. A second shunt capacitor 70 is connected in parallel across filter chokes 66 and 68, as at nodes A and B. Also connected at node B through lead 72 is the low voltage side of shunt capacitor 30 which was described in connection with the first preferred embodiment. In contrast with the first embodiment, the variable impedance means 32 is connected between ground and the return leg side of second shunt capacitor 70, as at node A. Also in contrast with the first embodiment is the collector 24 of load 20 which is connected, not to ground, but to the low voltage source 60 as at node B.

OPERATION

The operation of both presently preferred embodiments is substantially the same. Considering the invention first in its voltage regulator capacity, assume for the moment that the high voltage at output leg 14 has a certain amount of unwanted ripple in the form of an alternating current superimposed on the quiescent d.c. voltage. This case is chosen because it demonstrates fluctuations both above and below the quiescent, however it will be understood that the present invention, because of its wide bandwidth, will work equally well to remove spike noise or voltage transients which are less oscillatory in nature. The resistive divider network 42 senses the rise and fall of each ripple impulse and applies this sensed ripple signal to the error amplifier 48. The optional low pass filter 46 may be used to make the circuit more uniquely suited to filtering out the lower frequency multiples of power line ripple common to full wave bridge rectified voltage sources. Also applied to the error amplifier is a d.c. voltage reference source $V_{REF}$ which is adjusted in value to fine tune the power supply voltage. The error amplifier, operating in open loop configuration, appreciably amplifies the ripple signal which is applied through summing amplifier 50 to modulate the gate of field effect transistor 34. When the ripple signal is above the quiescent value, it causes a greater voltage drop across field effect transistor 34, which induces a greater voltage drop across field effect transistor 36, and so forth. The net effect of this positive ripple impulse is to decrease the overall impedance of the field effect network comprising the variable impedance means 32. This impedance decrease is scaled to produce a dropping voltage equal to the rising ripple voltage. Conversely, when the ripple voltage drops below the quiescent value the variable impedance means increases to produce less of a voltage drop. Because the variable impedance means 32 is coupled through shunt capacitor 30 to the high voltage output leg 14, this circuit is capable of absorbing or releasing electrical energy directly from or into the high voltage leg. This has the advantage of allowing the regulator circuit to respond quite rapidly to voltage fluctuations by providing an alternate energy path which avoids the relatively sluggish filter chokes 26 and 28 and the high voltage source 10. Another advantage of the invention resides in its ability to utilize state of the art active devices, such as FETs, which can be switched on and off quite rapidly making the circuit responsive to a wide range of frequencies. For instance, using popular FET devices the circuit has performed well at frequencies in excess of 1 megahertz. With improvements in high speed semiconductors even greater bandwidths can be expected.

Next considering the invention in its modulator capacity, assume that a modulating signal is applied to the modulation input means 52. The modulating signal may be a simple a.c. oscillation, for example, but it is not limited to that. Those skilled in the art will recognize that because of the circuits extended bandwidth any modulating waveform may be used, so long as it can be adequately represented by a Fourier series limited to the bandwidth. These waveforms include square waves, triangle waves, and even exotic pseudorandom noise (PRN), digital noise, and swept high frequency spot noise. The modulating signal is combined with the error amplifier signal in summing amplifier 50 to produce impedance changes in the variable impedance means 32. The low pass filter 46 becomes important in this application to allow the circuit to distinguish between unwanted power line ripple and the modulating signal; the latter is usually at a high frequency well above the pass band of the filter. The first feedback loop from resistive divider network 42 to variable impedance 32 may operate in a low frequency mode. The second feedback loop established through feedback resistor 54 is not frequency limited, thus the second loop allows simultaneous high frequency operation. Feedback resistor 54 also limits the gain of and stabilizes summing amplifier 50 according to conventional operational amplifier principles. This insures that the summing amplifier 50 will not drive the field effect transistors into saturation.

While the invention has been described in its preferred embodiments, it is to be understood that the words which have been used are words of description rather than limitation and that changes may be made within the purview of the appended claims without departing from the true scope and spirit of the invention in its broader aspects.

I claim:

1. A circuit for controlling electrical energy delivered to a load by a high voltage source of direct energy, said source supplying a voltage and a current, wherein said circuit comprises a first leg for conductively supplying said voltage and said current to said load, a second leg for conductively returning said current to said source, means for sensing said voltage conductively disposed between said first and second legs, capacitance means disposed between said first leg and said second leg for non-resonant storing of energy from said source and for releasing energy to said load, and continuously variable impedance means coupled to said capacitance means and responsive to said sensing means for controlling said storage and release of energy.

2. The circuit according to claim 1 which further comprises means for applying a time varying signal to control the impedance of said variable impedance means.

3. The circuit according to claim 1 wherein said sensing means comprises a resistive means coupled to said first leg.

4. The circuit according to claim 1 wherein said continuously variable impedance means comprises an active electronic device.

5. The circuit according to claim 1 wherein said variable impedance means comprises a plurality of active electronic devices in series relation to one another and a ladder network for biasing said active electronic devices.

6. The circuit according to claim 1 wherein said variable impedance means is conductively coupled intermediate said second leg and said load.

7. The circuit according to claim 5 wherein said ladder network is coupled to said second leg.

8. The circuit according to claim 1 which further comprises a means for providing a reference voltage and means for comparing said reference voltage with said sensed voltage to produce an error voltage.

9. The circuit according to claim 8 wherein said comparing means comprises a first amplifier and resistive means for coupling said reference voltage and said sensed voltage thereto.

10. The circuit according to claim 1 which further comprises means for filtering said sensed voltage.

11. A circuit for controlling electrical energy delivered to a load by a high voltage source of direct energy, said source supplying a voltage and a current, wherein said circuit comprises a first leg for supplying said voltage and said current to said load, a second leg for returning said current to said source, means for sensing said voltage, capacitance means disposed between said first leg and said second leg for storing energy from said source and for releasing energy to said load, variable impedance means coupled to said capacitance means and responsive to said sensing means for controlling said storage and release of energy, and, further comprising means for applying a time varying signal to control the impedance of said variable impedance means, wherein said means for applying a time varying signal comprises a second amplifier having an output coupled to said variable impedance means and having resistive means for coupling said time varying signal to said second amplifier.

12. A circuit for controlling electrical energy delivered to a load by a high voltage source of direct energy, said source supplying a voltage and a current, wherein said circuit comprises a first leg for supplying said voltage and said current to said load, a second leg for returning said current to said source, means for sensing said voltage, capacitance means disposed between said first leg and said second leg for storing energy from said source and for releasing energy to said load, variable impedance means coupled to said capacitance means and responsive to said sensing means for controlling said storage and release of energy, and, further comprising amplifier means coupled between said sensing means and said variable impedance means and feedback means for stabilizing said amplifier means.

13. A circuit for controlling electrical energy delivered to a load by a high voltage source of direct energy, said source supplying a voltage and a current, wherein said circuit comprises a first leg for supplying said voltage and said current to said load, a second leg for returning said current to said source, means for sensing said voltage, capacitance means disposed between said first leg and said second leg for storing energy from said source and for releasing energy to said load, variable impedance means coupled to said capacitance means and responsive to said sensing means for controlling said storage and release of energy, and, further comprising a low voltage source of direct energy coupled to said second leg and to said variable impedance means.

* * * * *